United States Patent [19]

Kanai et al.

[11] Patent Number: 5,294,285
[45] Date of Patent: Mar. 15, 1994

[54] PROCESS FOR THE PRODUCTION OF FUNCTIONAL CRYSTALLINE FILM

[75] Inventors: Masahiro Kanai; Shunri Oda, both of Tokyo; Isamu Shimizu, Yokohama, all of Japan

[73] Assignee: Canon Kabushiki Kaisha, Tokyo, Japan

[21] Appl. No.: 469,808

[22] Filed: Jan. 22, 1990

Related U.S. Application Data

[63] Continuation of Ser. No. 12,367, Feb. 9, 1987, abandoned.

[30] Foreign Application Priority Data

| Feb. 7, 1986 [JP] | Japan | 61-23693 |
| Feb. 13, 1986 [JP] | Japan | 61-27903 |
| Feb. 13, 1986 [JP] | Japan | 61-27905 |

[51] Int. Cl.$^5$ .......................................... C30B 25/14
[52] U.S. Cl. ..................................... 156/610; 156/613; 156/614; 437/85; 437/95
[58] Field of Search ........................ 156/610, 613, 614

[56] References Cited

U.S. PATENT DOCUMENTS

| 3,661,637 | 5/1972 | Sirtl | 148/175 |
| 4,138,509 | 2/1979 | Ingle et al. | 427/86 |
| 4,365,587 | 12/1982 | Hirose et al. | 118/723 |
| 4,448,801 | 5/1984 | Fukuda et al. | 427/53.1 |
| 4,454,835 | 6/1984 | Walsh et al. | 118/50.1 |
| 4,461,783 | 7/1984 | Yamazaki | 118/723 |
| 4,464,222 | 8/1984 | Gutsche | 156/614 |
| 4,490,192 | 12/1984 | Gupta et al. | 427/85 |
| 4,500,565 | 2/1985 | Hiramoto | 427/39 |
| 4,510,177 | 4/1985 | Furumura et al. | 148/174 |
| 4,522,674 | 6/1985 | Ninomiya et al. | 118/723 |
| 4,525,382 | 6/1985 | Sugioka | 427/54.1 |
| 4,526,805 | 7/1985 | Yoshizawa | 427/38 |
| 4,529,475 | 7/1985 | Okano et al. | 118/50.1 |
| 4,532,191 | 7/1985 | Ueno et al. | 427/39 |
| 4,544,423 | 10/1985 | Tsuge et al. | 427/39 |
| 4,556,584 | 12/1985 | Sarkozy | 427/54.1 |
| 4,569,855 | 2/1986 | Matsada et al. | 427/53.1 |
| 4,579,609 | 4/1986 | Reif et al. | 437/103 |
| 4,581,249 | 4/1986 | Kamiya | 427/53.1 |
| 4,624,736 | 11/1986 | Gee et al. | 427/53.1 |
| 4,628,862 | 12/1986 | Kamiya | 118/724 |
| 4,649,059 | 3/1987 | Eden et al. | 427/53.1 |
| 4,654,226 | 3/1987 | Jackson et al. | 427/54.1 |
| 4,657,777 | 4/1987 | Hirooka et al. | 427/39 |
| 4,664,940 | 5/1987 | Bensoussan et al. | 427/53.1 |
| 4,689,093 | 8/1987 | Ishihara et al. | 437/173 |
| 4,702,934 | 10/1987 | Ishihara et al. | 118/50.1 |
| 4,716,852 | 1/1988 | Tsujii et al. | 118/723 |
| 4,717,585 | 1/1988 | Ishihara et al. | 427/53.1 |
| 4,801,468 | 1/1989 | Ishihara et al. | 425/35 |
| 4,801,468 | 1/1989 | Ishihara et al. | 425/35 |

FOREIGN PATENT DOCUMENTS

| 1194818 | 8/1986 | Japan | 118/723 |
| 1194820 | 8/1986 | Japan | 118/723 |
| 1194823 | 8/1986 | Japan | 118/723 |
| 1194824 | 8/1986 | Japan | 118/723 |

OTHER PUBLICATIONS

Wolf et al., "Silicon Processing for the VLSI Era" Lattice Press, Sunset Beach, California, 1986, pp. 111-113.

*Primary Examiner*—Robert Kunemund
*Attorney, Agent, or Firm*—Fitzpatrick, Cella, Harper & Scinto

[57] ABSTRACT

There is provided an improved process of forming a functional epitaxial film by using two kinds of active species and chemically reacting them.

One of the species is an activated substance which contains silicon atoms or germanium atoms and halogen atoms. The other species is one which is generated from a chemical substance capable of contributing to formation of a film and chemically reactive with the former active species.

55 Claims, 2 Drawing Sheets

PROCESS FOR THE PRODUCTION OF FUNCTIONAL CRYSTALLINE FILM

This application is a continuation of application Ser. No. 07/012,367 filed Feb. 9, 1987, now abandoned.

FIELD OF THE INVENTION

This invention relates to an improved process for producing functional crystalline films. More particularly, it relates to an improved process for producing functional epitaxial films for use in electron devices such as semiconductor device, photosensor device for image input apparatus, photosensitive device for use in electrophotography etc.

BACKGROUND OF THE INVENTION

For the production of a functional film, especially a crystalline semiconductor film, an appropriate method has been employed in view of the required characteristics, use or the like for the film to be obtained. That is, there have been proposed various method using vacuum evaporation technique, thermal induced chemical vapor deposition technique, plasma chemical vapor deposition technique, reactive sputtering technique, ion plating technique and light induced chemical vapor deposition technique.

Among those methods, the method of thermal induced chemical vapor deposition (hereinafter referred to as "CVD method") had once been frequently used in various applications. However, such methods are not usually employed for the reason that, besides requiring an elevated temperature, a practically usable film cannot be obtained as expected.

On the other hand, the plasma chemical vapor deposition method (hereinafter referred to as "plasma CVD method") has been generally evaluated as being the most preferred and is currently used to prepare a deposited film on a commercial basis.

Now, although the plasma CVD method is widely used nowadays as above mentioned, that method is problematical due to the fact that it is practiced under elevated temperature conditions and other problems are associated with the apparatus to be used.

Regarding the former problems, because the plasma CVD method is practiced while maintaining a substrate at an elevated temperature, firstly the kind of a substrate to be used is limited to one that does not contain a material such as a heavy metal which can migrate and cause changes in the characteristics of a deposited film to be formed and secondly, its thickness is likely to be varied, whereby the resulting film lacks uniformity of thickness and homogeneity of the composition, which may itself also cause changes in the characteristics of the film to be formed.

Regarding the latter problems, the operating conditions employed with the plasma CVD method are much more complicated than the known CVD method, and are extremely difficult to be generalized.

That is, there already exist a number of variations even in the correlated parameters of substrate temperature, the amount and the flow rate of gases to be introduced, the pressure, the high frequency power for forming a film the structure of the electrodes, the structure of the reaction chamber, the exhaust rate, the plasma generation system, etc. Under these circumstances, in order to prepare a desirable functional deposited film for electron devices, it is required to choose precise parameters from a great number of varied parameters. And there sometimes occurs a serious problem that because of the precisely chosen parameters, the plasma may attain an unstable state which often imparts unexpected troublesome effects to functional deposited film to be formed.

In addition, in the case of desiring to form a crystalline functional deposited film, stably producing such film in accordance with the plasma CVD method is considered to be difficult since the related conditions to make a film to be crystalline are extremely limited under the plasma CVD method.

By the way, in recent years, the public attention has been focused on silicon-containing or germanium-containing functional crystalline deposited films, namely epitaxial deposited films, because of their wide usefulness.

And for their production, there have been proposed various methods which can be classified into two categories of vapor phase epitaxy and liquid phase epitaxy.

The liquid phase epitaxy is a method of depositing a semiconductor crystal on a substrate by dissolving a raw material for semiconductor in a metallic solvent in liquid state at elevated temperature until the raw material becomes supersaturated and cooling the solution.

For this method, there is an advantage that such a crystalline product as having a relevant completeness can be obtained since it is prepared in the state of being most closest to thermal equilibrium among various epitaxy techniques. However, there are unavoidable disadvantages, particularly, in the case of preparing optical devices for which an epitaxial layer having a thin and uniform thickness is required to be used. That is, the yield in its preparation is unsatisfactory and undesirable influences brought about because of poor mass productivity and unstable surface state of the film to be formed.

In view of the above, the liquid phase epitaxy is seldom used.

On the other hand, as for the vapor phase epitaxy, it has been often tried to practice using physical methods such as vacuum evaporation method and reactive sputtering method, and chemical methods such as hydrogen reduction method and thermal cracking method using organometallic compounds or metal hydrides. Among these methods, the molecular beam epitaxy, similar to the vacuum evaporation deposition method, is a dry process under ultra-high vacuum. Therefore, there are advantages for said epitaxy that it is possible to make a product highly purified and to grow the deposition of a film at low temperature and a relatively plane deposited film can be obtained. However, even for such epitaxy, there are disadvantages still remain unsolved that a surface defect density is large, any practically applicable method for controlling the directivity of the molecular beam is not yet developed, production of a large square deposited film is difficult, mass productivity is insufficient, and in addition to these disadvantages, an apparatus for practicing such epitaxy is too expensive.

In view of the above, the molecular beam epitaxy is not yet practiced on an industrial scale.

As for said hydrogen reduction method and thermal cracking method, they are generally called halide CVD method, hydride CVD method and MO-CVD method. And these methods are generally evaluated as being worth of being discussion since there are advantages that a film forming apparatus therefor can be relatively easily manufactured, highly purified metal halides, metal hydrides and organo-metals which are used as raw materials in such methods are generally available.

However, under these methods, since the temperature of a substrate is required to be high enough to allow the occurrence of the reduction reaction or thermal cracking, there is a limit for the kind of substrate which can be used. In addition, in the case where the raw material is not sufficiently decomposed, contaminations with the impurities such as carbon atoms, halogen atoms are apt to occur and as a result, it becomes difficult to control the doping degree.

Under this circumstance, even if a desirable functional crystalline film should be fortunately produced, the functional crystalline film product will become costly for the reasons that a heavy investment is necessitated to set up a particularly appropriate apparatus therefor.

In this regard, for mass-producing a desirable functional crystalline deposited film, particularly, a functional silicon-containing or germanium-containing epitaxial film, it is desired to modify or change the currently known methods so that it makes it possible to effectively form such film.

In fact, there is now an increased demand for providing a method that makes it possible to practice the process at lower temperature and at a high film forming rate in a simple apparatus to mass-produce a desirable functional epitaxial film applicable in any electron devices which has satisfactory uniformity and has practically applicable characteristics.

SUMMARY OF THE INVENTION

The present inventors have conducted extensive studies in order to solve the problems in the aforementioned known methods and in order to develop a new process for effectively and simply preparing a functional epitaxial film containing silicon atoms or germanium atoms and halogen atoms.

As a result, the present inventors have finally found a method that enables efficient and stable preparation of a desirable functional epitaxial film widely usable in the preparation of various electron devices according to the simplified procedures as detailed below.

It is therefore an object of this invention to provide an improved high quality expitaxial film which has desirable and practically applicable electric, optical and semi-conductive characteristics and which is effectively usable in various electron devices such as semiconductor device, image input line sensor, image pickup device, photosensitive device for use in electrophotography and the like.

Another object of this invention is to provide a new process for preparing the above epitaxial film by which simplification of the film forming conditions therefor, enlargement of the areas, improvement of the productivity and the mass-production can be accomplished while maintaining the characteristics of the film to be formed and promoting the deposition rate, the repeatability and the uniformity in quality.

A further object of this invention is to provide a new process for preparing the above epitaxial film by using an active species containing silicon atoms or germanium atoms and halogen atoms and another active species generated from a chemical substance capable of contributing to formation of a film and by chemically reacting the two active species to form the above epitaxial film.

DESCRIPTION OF THE INVENTION

Figure 1:
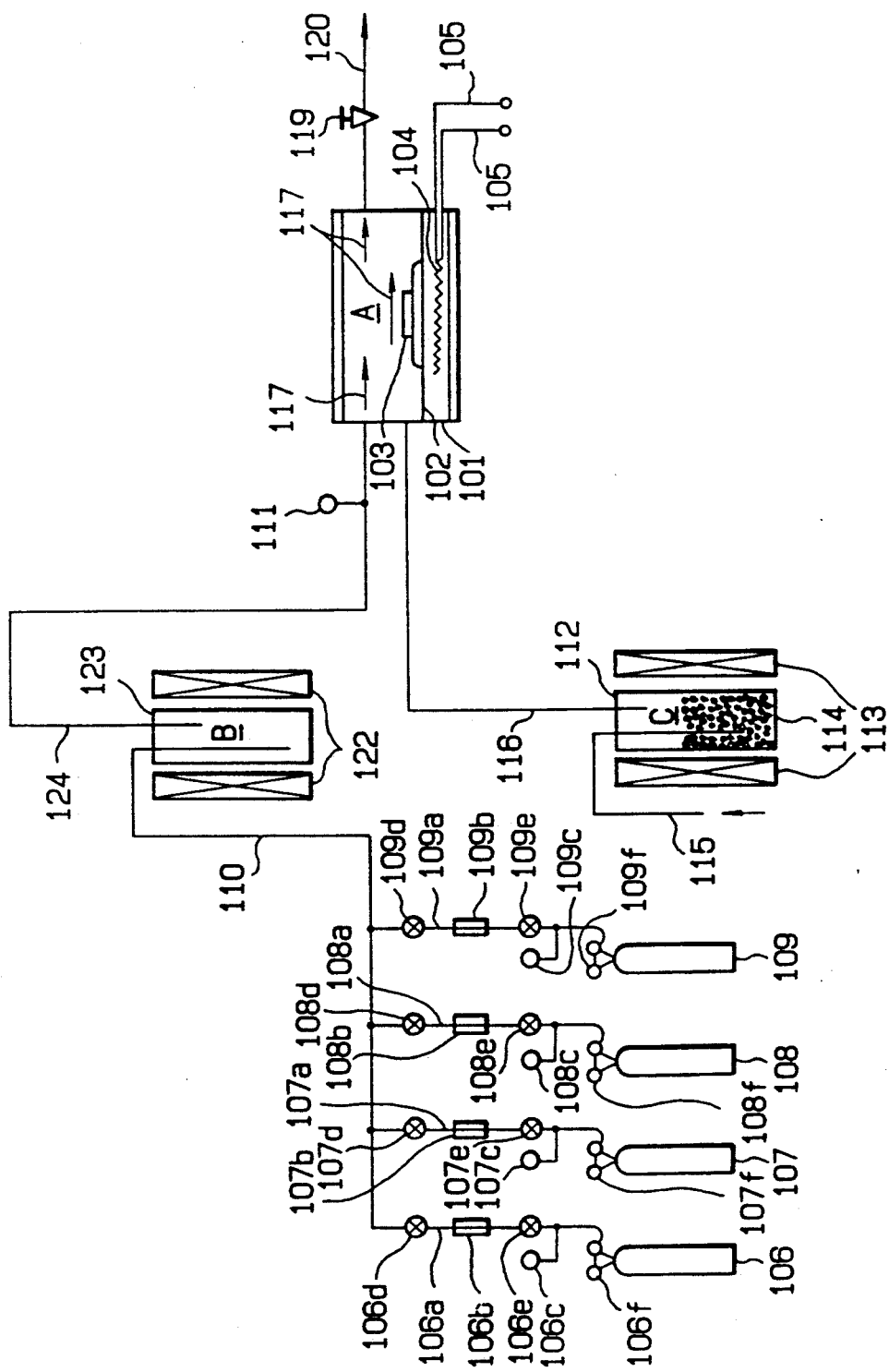
FIG. 1 is a schematic explanatory view of a fabrication apparatus as an example of the apparatus for preparing the functional epitaxial film according to this invention; and, FIG. 2 is a representative modification of the apparatus shown in FIG. 1.

This invention provides a new and effective procss aiming at accomplishment of simplification of the film forming conditions for the preparation of a non-doped functional epitaxial film, an n-type impurity doped functional epitaxial film or a p-type impurity doped functional epitaxial film so as to enable their mass-production while maintaining the characteristics of the film to be formed and promoting the deposition rate at relatively lower temperature in a film deposition space.

According to this invention, a desirable functional expitaxial film having a wealth of many desirable electric, optical and semiconductive characteristics, which has an uniform thickness and a desirable homogeneity and which is usable in various electron devices, may be effectively formed at an improved deposition rate without the formed layer peeling off from the substrate, and the layer which is formed on the substrate is not affected either by any of the undesirable materials removed from the inner surface of the surrounding wall of the film deposition space or by the residual gases remaining in the film deposition space, because the film deposition space, the active species A generation space and the active species generation space B are individually situated.

In addition, according to this invention, the control of the film forming conditions is relaxed and quality control of a film to be formed can be easily implemented because the film deposition space is situated separately from the space for generating the active species A and from the space for generating the active species B, and the former space and the latter space being separate from one another, this being disinguished from the case of any of the known methods.

According to the first representative embodiment of this invention, the process according to this invention comprises: generating an active species A containing silicon atoms or germanium atoms and halogen atoms as the constituent atoms to be the constituents of an objective functional epitaxial film in an active species A generation space; simultaneously generating another active species B containing hydrogen atoms or/and halogen atoms as the constituent atoms which can chemically react with the active spieces A and which can contribute to formation of said film in an active species B generation space; introducing the resulting active species A and B separately into a film deposition space having a selected substrate being kept at a predetermined temperature; and chemically reacting the active species A and B to thereby form the objective functional expitaxial film on the substrate.

Now, the term "active species A" means an activated substance which is generated by subjecting an active species A raw material gas containing silicon atoms or germanium atoms and halogen atoms to be the constituents of the functional epitaxial film of this invention to the action of an excitation energy source and which can chemically react with the active species B to thereby cause formation of said epitaxial film.

The term "active species B" means an activated substance which is generated by subjecting an active species B raw material gas containing hydrogen atoms or/and halogen atoms to be the constituents of the functional expitaxial film of this invention to the action of an excitation energy source and which can chemically react with the active species A to thereby cause formation of said epitaxial film.

According to the process of the first embodiment addition, by controlling the temperature of the inner atmosphere of the film deposition space and the temperature of the substrate appropriately as desired, the film forming process may effectively proceed to thereby stable obtain a desirable functional epitaxial film.

According to the second representative embodiment of this invention, the process according to this invention comprises: generating an active species A containing silicon atoms or germanium atoms and halogen atoms as the constituent atoms to be the constituents of an objective functional epitaxial film in an active species A generation space; simultaneously generating another active species B containing hydrogen atoms or/and halogen atoms as the constituent atoms which can chemically react with the active species A and which can contribute to formation of said film in an active species B generation space; introducing the resulting active species A and B separately into a film deposition space having a selected substrate being kept at a predetermined temperature; and chemically reacting the active species A and B while being exposed to an excitation energy to thereby form the objective functional epitaxial film on the substrate.

According to the process of the second representative embodiment of this invention, the chemical reaction between the active species A and B is further effectively promoted so that the objective functional epitaxial film having no or slight structural defect may be stably formed on the substrate at high film forming rate even when the substrate being kept at low temperature.

According to the third representative embodiment of this invention, the process according to this invention comprises: generating an active species A containing silicon atoms or germanium atoms and halogen atoms as the constituent atoms to be the constituents of an objective functional epitaxial film in an active species A generation space; simultaneously generating another active species B containing hydrogen atoms or/and halogen atoms as the constituent atoms which can chemically react with the active species A and which can contribute to formation of said film in an active species B generation space; introducing the resulting active species A and B separately into a film deposition space having a selected substrate being kept at a predetermined temperature; starting the chemical reaction between the active species A and B; and subjecting the film being deposited on the substrate to heat treatment with an excited energy supplied internally or externally by way of an excited energy generation means to thereby form the objective functional epitaxial film on the substrate.

According to the process of the third representative embodiment of this invention, a desired functional epitaxial film having no or extremely slight structural defect can be obtained at high film forming rate without raising the temperature of the substrate.

Now, the active species A to be employed in this invention is one that becomes a principal constituent of the functional epitaxial film to be formed as a result of the chemical reaction with the active species B in the film deposition space.

The longer the average life span of the active species A the better in view of the productivity and handling efficiency. A substance whose average life span is preferably greater than 0.1 second, more preferably greater than 1.0 second, and most preferably greater than 10 seconds is used. The generation of the active species A to be used in this invention in the active species A generation space can be properly carried out by activating a selected raw material gas to generate the active species A, for example, by subjecting it to the action of an excitation energy source such as electric discharge of microwave, RF (radio frequency), low frequency or DC (direct current), heat of electric heater or infrared heater, or light, or by contacting it with a catalyst or by adding the catalyst thereto.

A suitable chemical compound is used for the generation of the active species A to be used in this invention.

As such a compound, there is used a compound containing silicon atoms and halogen atoms or a compound germanium atoms and halogen atoms.

As the silicon and halogen containing compound, there can be mentioned such that part or the entire of the hydrogen atoms of chain or cyclic silicon hydrides are substituted by halogen atoms, for example, chain silicon halides represented by the general formula: $Si_u Y_{2u+2}$ wherein u is an integer of 1 or more, and Y is a member selected from the group consisting of F, Cl, Br and I, cyclic silicon halides represented by the general formula: $Si_v Y_{2v}$ wherein v is an integer of 3 or more and Y has the same meaning as above mentioned, and chain or cyclic compounds represented by the general formula: $Si_u H_x Y_y$ wherein u and Y have the same meanings as above mentioned, and $x+y=2u$ or $x+y=2u+2$.

Specific examples are $SiF_4$, $(SiF_2)_5$, $(SiF_2)_6$, $(SiF_2)_4$, $Si_2F_6$, $Si_3F_8$, $Si_4F_{10}$, $SiHF_3$, $SiH_2F_2$, $SiH_3F$, $SiCl_4$, $(SiCl_2)_5$, $SiBr_4$, $(SiBr_2)_5$, $Si_2Cl_6$, $Si_3Cl_8$, $Si_2Br_6$, $Si_3Br_8$, $SiHCl_3$, $SiH_2Cl_2$, $SiHBr_3$, $SiH_2Br_2$, $SiHI_3$, $SiH_2I_2$, $Si_2H_3F_3$, $Si_2Cl_3F_3$, etc. which are in the gaseous state or can be easily made to be in the gaseous state.

And it is possible to use one of these compounds or a mixture of two or more of them.

As the germanium and halogen containing compound, there can be mentioned such that part or the entire of the hydrogen atoms of chain or cyclic germanium hydrides are substituted by halogen atoms, for example, chain germanium halides represented by the general formula: $Ge_u Y_{2u+2}$ wherein u is an integer of 1 or more and y is a member selected from the group consisting of F, Cl, Br and I, cyclic germanium halides represented by the general formula: $Ge_v Y_{2v}$ wherein v is an integer of 3 or more and Y has the same meaning as above mentioned, and chain or cyclic compounds represented by the general formula: $Ge_u H_x Y_y$ wherein u and Y have the same meanings as above mentioned, and $x+y=2u$ or $x+y=2u+2$.

Specific examples are $GeF_4$, $(GeF_2)_5$, $(GeF_2)_6$, $(GeF_2)_4$, $Ge_2F_6$, $Ge_3F_8$, $GeHF_3$, $GeH_2F_2$, $GeH_3F$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, $Ge_2H_3F_3$, $Ge_2Cl_3F_3$, etc. which are in the gaseous state or can be easily made to be in the gaseous state.

And it is possible to use one of these compounds or a mixture of two or more of them.

Other than those compounds as above mentioned, it is possible for the raw material gas to be used for the generation of the active species A to be such as below mentioned.

That is, they are raw material gas containing silicon atoms and halogen atoms which are obtained by blowing a halogen gas such as $F_2$ gas, $Cl_2$ gas, gasified $Br_2$ or $I_2$ into silicon solid particles being kept at elevated temperature and a raw material gas containing germanium atoms and halogen atoms which is obtained by blowing one of said halogen gases into germanium solid particles being kept at elevated temperature.

It is a matter of course to say that an appropriate halogen gas can be used together with the silicon and halogen containing compound or the germanium and halogen containing compound as above mentioned respectively in the gaseous state as the raw material gas to generate the active species A.

The generation of the active species B to be used in this invention in the active B generation space can be properly carried out by activating a selected raw material gas to generate the active species B, for example, by subjecting it to the action of one of the excitation energy sources as above mentioned in the case of generating the active species A.

A suitable chemical substance is used for the generation of the active species B to be used in this invention.

Such chemical substances are, for example, $H_2$ gas, $F_2$ gas, $Cl_2$ gas, gasified $Br_2$ or $I_2$, etc., and alternatively, rare gases such as He, Ne, Ar, etc. are also usable.

In the case of using plural kinds of these gases it is possible to introduce those gases individually or a mixture of two or more of those gases into the active species B generation space.

As an alternative for the generation of the active species B in this invention using plural kinds of raw materials, it is possible to generate plural kinds of the active species B in respective active species B generation spaces and introduce them separately into the film deposition space.

The volume ratio of the active species B to the active species A to be introduced into the film deposition space should be determined with due regard to the film forming conditions, the kind of active species B to be used and the kind of active species A to be used etc., but it is preferably 20:1 to 1:20 and more preferably 10:1 to 1:10 on the basis of a flow amount ratio.

Now, as for the excitation energy to be employed in the second embodiment of the process according to this invention, any of the excitation energy sources as above mentioned in the case of generating the active species A can be optionally used. In a preferred embodiment of this case, light energy or/and heat energy are used together with discharge energy. And in the case of using light energy, it is advantageous since it can be applied all over or on the predetermined part of the film forming inner atmosphere or the substrate so that the position or and the thickness of the film to be formed on the substrate can be controlled as desired.

In the case of the third embodiment of the process according to this invention, those excitation energy sources such as laser of Ar, ruby, yag or excimer, electron beam, ion beam, high power lamp or high power heater can be optionally used. And an excitation energy of such source is applied on the film or on the substrate where the film formation process is being proceeded.

The application of the excitation energy of such source is usually conducted in the pulse state or by CW scanning, and is continued for a longer period than the accommodation coefficient of the film to be deposited.

In that case, it is possible to appropriately control the quality of the resulting deposited film to be from polycrystalline state to monocrystalline state by selecting the kind of the excitation energy source to be used and appropriately changing the luminous energy per an unit hour, the irradiation period or other related conditions.

For the deposited film prepared according to this invention, it is possible to be doped with an appropriate p-type or n-type impurity during its formation process or after terminating the process.

As the p-type impurity, there may be used an element of Group IIIA of the Periodic Table such as B, Al, Ga, In, Tl or the like. Of these p type impurities, B and Ga are the most appropriate. As the n-type impurity, there may be used an element of Group VA of the Periodic Table such as P, As, Sb, Bi or the like. Of these n-type impurities, P and Sb are the most appropriate.

The amount of the p-type impurity or the n-type impurity to be contained in the resulting film may be optionally determined in accordance with its electric and optical characteristics as required therefor.

As a dopant imparting a substance capable of incorporating the impurity into the film, a substance which is in a gaseous state at room temperature under atmospheric pressure condition or another substance which can be easily made to be in a gaseous state, at least under the activating conditions for either the active species A or the active species B.

Such substance are, for example, $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.

It is possible to use one or more of these substances.

In order to activate the dopant imparting substance, it can be introduced together with the raw material for the active species A or/and the raw material for the active species B into the active species A generation space or/and the active species B generation space.

As an alternative, it is possible to introduce the dopant inparting substance into a special activation space for activating it with the action of an excitation energy in the same way as mentioned in the case of generating the active species A and to introduce the resulting active species of the dopant imparting substance (hereinafter referred to as "active species PN") into the film deposition space.

As for the substrate to be used in this invention, Si-monocrystal wafer plate or GaAs-monocrystal wafer plate are the most appropriate since a desired functional epitaxial film may be formed when such plate is used as the substrate. However, other than these, sapphire monocrystal plate, $Al_2O_3$ plate, silica plate or the like may be also appropriately used.

The temperature (Ts) of the substrate in this invention should be properly determined depending upon the kind of a film to be formed and the kind of a substrate to be used.

For instance, in the case of forming a silicon containing epitaxial film, the Ts is preferably 200° C. to 900° C. and more preferably 300° C. to 800° C. And in the case of forming a germanium containing epitaxial film, the Ts is preferably 150° C. to 700° C. and more preferably 250° C. to 600° C. It will therefore be appreciated that the lower end of the substrate temperature range is 150° C., in the case where the epitaxial film contains germanium, and the upper end thereof is 900° C., when the epitaxial film contains silicon. In the practice of the more preferred embodiment, the substrate temperature range is from 250° C. to 800° C.

In any case, the better the orientation of a substrate to be used is, at the lower substrate temperature an epitaxial film having the better quality can be formed.

PREFERRED EMBODIMENT OF THE INVENTION

FIG. 1 is a schematic view illustrating a representative apparatus for practicing the process according to this invention.

In FIG. 1, there is shown a film forming chamber 101 having inner space A in which a substrate holder 102 for substrate 103 having electric heater 104 connected to a power source (not shown) by means of to lead wires 105, 105 is provided. The substrate holder is so designed that it can be moved horizontally in either right hand or left hand direction by an appropriate driving means (not shown) during film forming process. The film forming chamber 101 is provided with an exhaust pipe 120 connected through main valve 119 to an exhaust pump, and the exhaust pipe is provided with a subsidiary valve (not shown) serving to break the vacuum in the film forming chamber 101.

The electric heater 104 serves to heat the substrate 103 to a predetermined temperature prior to starting film forming process and to maintain the temperature thereof at a predetermined temperature during the film forming process.

The electric heater 104 also serves to anneal the resulting film deposited on the substrate 103 for further improving the characteristics of the film after the film forming process has been completed.

A series of gas reservoirs 106, 107, 108 and 109 stands for a raw material gas feeding system. In the raw material gas feeding system, there are shown gas supplying pipe ways 106a through 109a respectively extending from the gas reservoirs 106, 107, 108 and 109, mass flow controllers 106b through 109b being placed respectively on the gas supplying pipe ways 106a through 109a for controlling the flow rate of a raw material gas from each of the gas reservoirs 106 through 109, pressure gases 106c through 109c, main valves 106d through 109d, subsidiary valves 106e through 109e and gas reservoir pressure gages 106f through 109f.

Each of the gas supplying pipe ways 106a through 109a is connected to a feed pipe 110, which is connected to an active species B generation chamber 123. The other end of the feed pipe 110 is extended into inner space B of the active species B generation chamber 123 passing through its upper wall portion.

124 indicates an active species B transporting conduit having a gas pressure gase which is connected to the film forming chamber 101. The active species B generation chamber 123 is provided with a microwave plasma generator 122 to generate an excited energy within the inner space B of the active species B generation chamber 123.

114 indicates an active species A generation chamber which is provided with an infrared heating furnace or microwave plasma generator 113. 115 indicates a gas supplying pipe for a raw material gas which reacts with Si solid particles 114 being stored in an inner space C of the active species A generation chamber 114 to produce the active species A. The inner space can, however, be vacant.

One end of the gas supplying pipe 115 is connected to a gas reservoir (not shown) and the other end thereof opens into the Si solid particles or Ge solid particles 114. 116 indicates an active species A transporting conduit which opens into the inner space C of the active species A generation chamber 114 at its one end and is connected to the film forming chamber 110 at the other end.

117 indicates the flow direction of each of the active species A and B in the inner space A of the film forming chamber.

Figure 2:
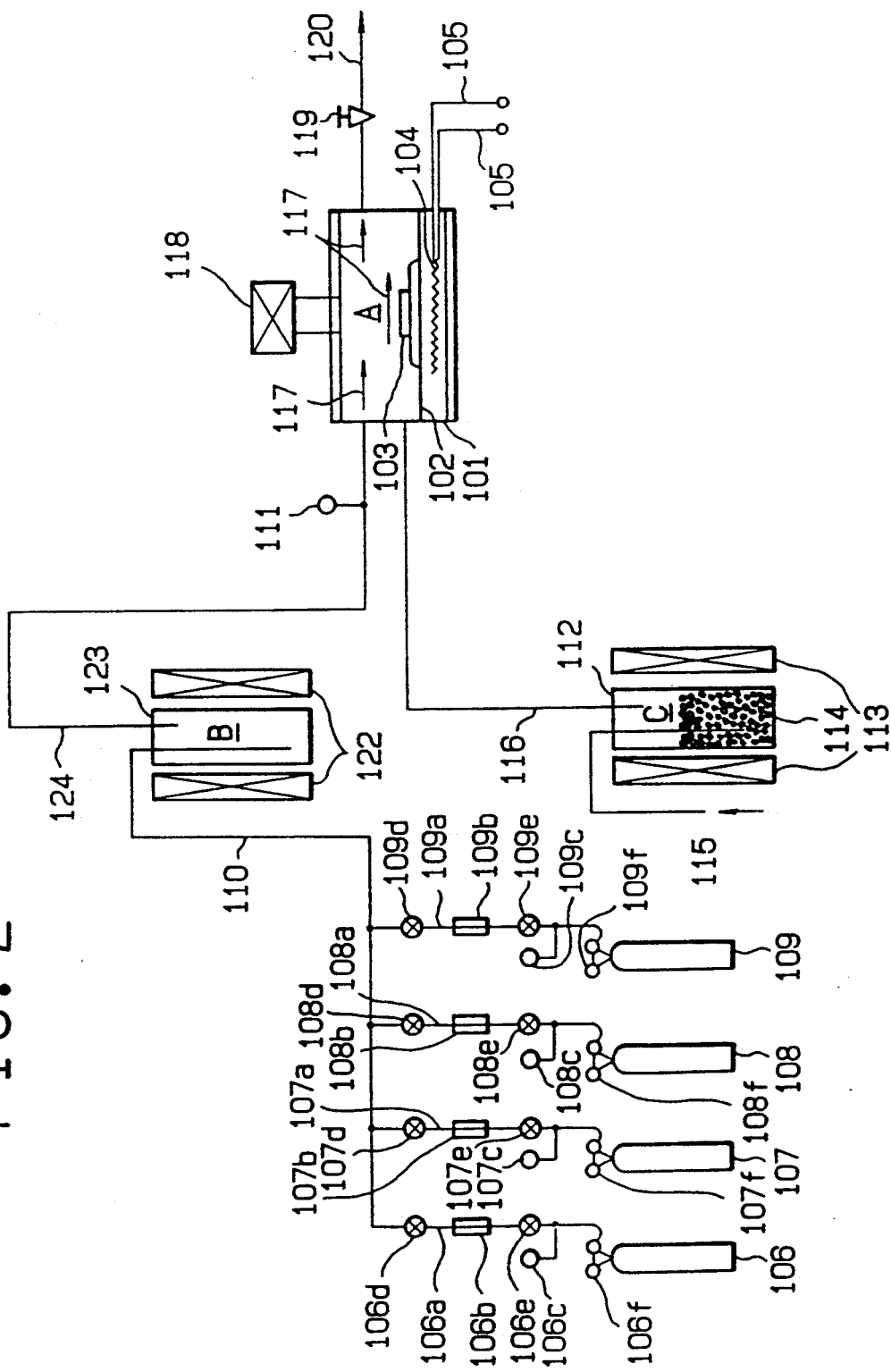

FIG. 2 is a schematic view illustrating a modified representative example of the apparatus shown in FIG. 1.

That is, the apparatus shown in FIG. 2 comprises disposing an excited energy generating means 118 over outer wall face of the film forming chamber 101. The excited energy generating means is electrically connected to the film forming chamber and serves to promote the chemical reaction between the active species A and B.

In any of the apparatuses shown in FIGS. 1 and 2, a gaseous raw chemical substance capable of contributing to formation of the active species B, an inert gas, a gaseous raw material for supplying the group III A or group V A atoms etc. are stored in respective gas reservoirs. The number of the gas reservoirs in the raw material gas feeding system may be either increased or decreased according to the number of the kinds of gaseous raw materials to be used.

The advantages of this invention are now described in more detail by reference to the following Examples 1 to 22, which are provided merely for illustrative purposes only, and are not intended to limit the scope of this invention.

The apparatus shown in FIG. 1 was used in Examples 1 through 9, and the apparatus shown in FIG. 2 was used in Examples 10 through 22.

EXAMPLE 1

As the substrate 103, an n+-type Si-monocrystal wafer plate of 3 inches in diameter was used.

This substrate was firmly attached to the surface of the substrate holder 102. The air in the film forming chamber was evacuated by opening the main valve 119 to bring the chamber to a vacuum of about $1 \times 10^{-6}$ Torr.

Then the heater 104 was activated to uniformly heat the substrate 103 to about 600° C. and it was kept at this temperature.

At the same time, $H_2$ gas as the active species B raw material from the gas reservoir 106 was fed through the feed pipe 110 into the active species B generation chamber 123 at a flow rate of 120 sccm. After the flow rate of the $H_2$ gas became stable, the microwave plasma generator 122 was switched on to apply a discharge energy into the inner space B whereby to generate an activated hydrogen as the active species B. The resulting activated hydrogen was then introduced through the active species B transporting conduit into the film forming chamber 101.

In parallel, $SiF_4$ gas as the active species A raw material from a reservoir (not shown) was blown at a flow rate of 40 sccm through the gas supplying pipe 115 into Si solid particles 114 being stored in the active species A generation chamber 112 which was being kept at 1100° C. by the action of the infrared heating furnace whereby to generate $SiF_2^*$ as the active species A followed by introducing it through the active species A transporting conduit 116 into the film forming chamber 101. And the formation of a silicon containing deposited epitaxial film on the foregoing substrate was carried out under the reduced innner pressure condition of 0.3 Torr.

The film forming speed in this case was 12 μm/hr. The resulting non-doped silicon-containing epitaxial film was subjected to X-ray diffraction analysis by X-ray diffractometer. As a result, it was found that there had occurred a crystal growth of the same crystal face (100) as that of the Si-monocrystal wafer as the substrate and it had a slight grid defect.

And, as a result of observing the surface state of the film by scanning electron microscope, it was found that it was of excellent smoothness without any undesirable wave pattern and the unevenness of its thickness was less than ±5%.

Then, a schottky electrode was prepared by forming an Au-thin layer of 0.5 mm$\phi$ in accordance with the conventional vacuum deposition process. When a predetermined voltage was impressed from the reverse side of the substrate to make the shottky electrode to be of reverse bias, and its carrier density at room temperature was measured according to Capacitance - Voltage method, the value was about $5.0 \times 10^{13}$ cm$^{-3}$.

As a result, it was found that the foregoing nondoped silicon-containing film was of excellent film quality.

EXAMPLE 2

The procedures of Example 1 were repeated, except that a silica glass of 5 cm ×5 cm in size was used in stead of the n+-type Si-monocrystal wafer as the substrate, the flow rate of H$_2$ gas was changed to 200 sccm and the temperature of the substrate was changed to 700° C., to thereby obtain a deposited film.

The resulting film was subjected to X-ray diffraction analysis in accordance with the same procedures as in Example 1, and it was found that an expitaxial film having the (100) crystal face had been formed on the substrate. It was also found that the unevenness of the thickness of the film was less than ±5%.

Further, when the situations of the carrier density, electron mobility and hole mobility on the resulting film were measured by van der Pauw method, the values for them were about $9.0 \times 10^{13}$ cm$^{-3}$, 1000 cm$^2$/V.sec., and 400 cm$^2$/V. sec. respectively.

EXAMPLE 3

Following the procedures of Example 1, B$_2$H$_6$/H$_2$ gas (content of B$_2$H$_6$: 1000 ppm) from the gas reservoir 107 was fed at the flow rates to of 5 sccm, 50 sccm and 300 sccm respectively into the active species B generation chamber 123 in addition to H$_2$ gas whereby to form three kinds of deposited films separately.

In that case, the doping efficiency on the respective resulting deposited films at room temperature was examined in accordance with van der Pauw method.

The results were as shown in Table 1. According the results of Table 1, it was found that any of the three deposited films had been effectively doped with the p-type dopant.

TABLE 1

| The kind and flow rate of gaseous dopant | σd (S · cm$^{-1}$) | Hole mobility (cm$^2$/V · sec) | Carrier density (cm$^{-3}$) |
|---|---|---|---|
| B$_2$H$_6$ (1000 ppm, diluted with H$_2$) 5 sccm | $1.5 \times 10^{-3}$ | 200 | $5.0 \times 10^{16}$ |

TABLE 1-continued

| The kind and flow rate of gaseous dopant | σd (S · cm$^{-1}$) | Hole mobility (cm$^2$/V · sec) | Carrier density (cm$^{-3}$) |
|---|---|---|---|
| B$_2$H$_6$ (1000 ppm, diluted with H$_2$) 50 sccm | $3.5 \times 10^{-2}$ | 120 | $6.0 \times 10^{17}$ |
| B$_2$H$_6$ (1000 ppm, diluted with H$_2$) 300 sccm | $1.0 \times 10^{-1}$ | 50 | $8.0 \times 10^{18}$ |

EXAMPLE 4

Following the procedures of Example 1, a p+-type Si-monocrystal wafer plate was used in stead of the n+-type Si-monocrystal wafer plate, and PH$_3$/H$_2$ gas (content of PH$_3$: 1000 ppm) was fed at the flow rates of 5 sccm, 50 sccm and 350 sccm respectively into the active species B generation chamber 123 in addition to H$_2$ gas whereby to form three kinds of deposited films separately.

In that case, the doping efficiency at room temperature on the resulting deposited films was examined in accordance with van der Pauw method. The results were as shown in Table 2. According to the results of Table 2, it was found that any of the three deposited films had been effectively doped with the n-type dopant.

TABLE 2

| The kind and flow rate of gaseous dopant | σd (S · cm$^{-1}$) | Electron mobility (cm$^2$/V · sec) | Carrier density (cm$^{-3}$) |
|---|---|---|---|
| PH$_3$ (1000 ppm, diluted with H$_2$) 5 sccm | $2.0 \times 10^{-3}$ | 850 | $4.0 \times 10^{16}$ |
| PH$_3$ (1000 ppm, diluted with H$_2$) 50 sccm | $4.5 \times 10^{-2}$ | 700 | $7.0 \times 10^{17}$ |
| PH$_3$ (1000 ppm, diluted with H$_2$) 350 sccm | $2.0 \times 10^{-1}$ | 120 | $8.5 \times 10^{18}$ |

EXAMPLE 5

As the substrate 103, an n+-type GaAs-monocrystal wafer plate was used.

This substrate was firmly attached to the surface of the substrate holder 102. The air in the film forming chamber 101 was evacuated by opening the main valve to bring the chamber to a vacuum of about 10$^{-6}$ Torr.

Then the heater 104 was activated to uniformly heat the substrate 103 to about 450° C. and it was kept at this temperature.

At the same time, H$_2$ gas as the active species B raw material from the gas reservoir 106 was fed through the feed pipe 110 into the active species B generation chamber 123 at a flow rate of 100 sccm. After the flow rate of the H$_2$ gas became stable, the microwave plasma generator 122 was switched on to apply a discharge energy into the inner space B whereby to generate an activated hydrogen as the active species B. The resulting activated hydrogen was then introduced through the active species B transporting conduit into the film forming chamber 101.

In parallel, GeF$_4$ gas as the active species A raw material from a reservoir (not shown) was blown at a flow rate of 30 sccm through the gas supplying pipe 115 into the active species A generation chamber 112 not containing any particles and the GeF$_4$ gas was activated by the action of the microwave plasma generating means whereby to generate GeF$_2$* as the active species A followed by introducing it through the active species A transporting conduit 116 into the film forming chamber 101. And the formation of a germanium containing deposited epitaxial film on the foregoing substrate was carried out under the reduced inner pressure condition of 0.3 Torr.

The film forming speed in this case was 12 m/hr. The resulting non-doped germanium-containing epitaxial film was subjected to X-ray diffraction analysis by X-ray diffractometer. As a result, it was found that there had occurred a crystal growth of the same crystal face (100) as that of the GaAs-monocrystal wafer as the substrate and it had a slight grid defect.

And, as a result of observing the surface state of the film by scanning electron microscope, it was found that it was of excellent smoothness without any undesirable wave pattern, and the unevenness of its thickness was less than ±5%.

Then, a schottky electrode was prepared by forming an Au-thin layer of 0.5 mm$\phi$ in accordance with the conventional vacuum deposition process. When a predetermined voltage was impressed from the reverse side of the substrate to make the shottky electrode to be of reverse bias, and its carrier density at room temperature was measured according to Capacitance - Voltage method, the value was about $5.0 \times 10^{13}$ cm$^{-3}$.

As a result, it was found that the foregoing nondoped germanium-containing film was of excellent film quality.

EXAMPLE 6

The procedures of Example 5 were repeated, except that a silica glass of 5 cm ×5 cm in size was used instead of the n$^+$-type GaAs-monocrystal wafer plate as the substrate, the flow rate of H$_2$ gas was changed to 250 sccm and the temperature of the substrate was changed to 700° C., to thereby obtain a deposited film.

As a result that the resulting film was subjected to X-ray diffraction analysis in accordance with the same procedures as in Example 1, it was found that an expitaxial film having the (100) crystal face had been formed on the substrate. And it was also found that the unevenness of the thickness of the film was less than ±5%.

Further, when the situations of the carrier density, electron mobility and hole mobility on the resulting film were measured by van der Pauw method, the values for them were about $9.5 \times 10^{13}$ cm$^{-3}$, 3000 cm$^2$/V.sec., and 950 cm$^2$/V.sec respectively.

EXAMPLE 7

Following the procedures of Example 5, B$_2$H$_6$/H$_2$ gas (content of B$_2$H$_6$: 1000 ppm) was fed at the flow rates of 5 sccm, 50 sccm and 300 sccm respectively into the active species B generation chamber 123 in addition to H$_2$ gas whereby to form three kinds of deposited films separately.

In that case, the doping efficiency on the respective resulting deposited films at room temperature was examined in accordance with van der Pauw method. The results were as shown in Table 3. According to the results of Table 3, it was found that any of the three deposited films had been effectively doped with the p-type dopant.

TABLE 3

| The kind and flow rate of gaseous dopant | $\sigma d$ (S · cm$^{-1}$) | Hole mobility (cm$^2$/V · sec) | Carrier density (cm$^{-3}$) |
|---|---|---|---|
| B$_2$H$_6$ (1000 ppm, diluted with H$_2$) 5 sccm | 5.0 | 800 | $7.5 \times 10^{16}$ |
| B$_2$H$_6$ (1000 ppm, diluted with H$_2$) 50 sccm | $6.0 \times 10^1$ | 650 | $9.0 \times 10^{17}$ |
| B$_2$H$_6$ (1000 ppm, diluted with H$_2$) 300 sccm | $4.5 \times 10^2$ | 300 | $1.5 \times 10^{19}$ |

EXAMPLE 8

Following the procedures of Example 5, a p$^+$-type GaAs monocrystal plate was used instead of the n$^+$-type GaAs monocrystal plate, and PH$_3$/H$_2$ gas (content of PH$_3$: 1000 ppm) was fed at the flow rates of 5 sccm, 50 sccm and 350 sccm respectively into the active species B generation chamber 123 in addition to H$_2$ gas thereby forming three kinds of deposited films separately.

In that case, the doping efficiency at room temperature on the respective resulting deposited films was examined in accordance with van der Pauw method. The results were as shown in Table 4. According to the results of Table 4, it was found that any of the three deposited films had been effectively doped with the n-type dopant.

TABLE 4

| The kind and flow rate of gaseous dopant | $\sigma d$ (S · cm$^{-1}$) | Electron mobility (cm$^2$/V · sec) | Carrier density (cm$^{-3}$) |
|---|---|---|---|
| PH$_3$ (1000 ppm, diluted with H$_2$) 5 sccm | 6.0 | 2500 | $8.0 \times 10^{16}$ |
| PH$_3$ (1000 ppm, diluted with H$_2$) 50 sccm | $7.5 \times 10^1$ | 2000 | $9.5 \times 10^{17}$ |
| PH$_3$ (1000 ppm, diluted with H$_2$) 350 sccm | $5.5 \times 10^2$ | 800 | $2.0 \times 10^{19}$ |

EXAMPLE 9

The procedures of Example 1 were repeated, except that a silica glass of 5 cm×5 cm in size having an n$^+$-type poly-Si layer of 5 μm in thickness was used in stead of the n$^+$-type Si-monocrystal wafer plate as the substrate, the flow rate of H$_2$ was changed to 150 sccm and the temperature of the substrate was changed to 650° C., whereby to obtain a deposited film.

The resulting film was subjected to electron diffraction analysis in accordance with the RHEED Pattern using the conventional electron diffractograph, and it was found that an epitaxial film having the (100) crystal face of silicon had been formed on the substrate. And, it was also found that the unevenness of the film was less than ±5%.

Further, when the situations of carrier density, electron mobility and hole mobility on the film were measured by van der Pauw method, the values for them were about $9.5 \times 10^{13}$ cm$^{-3}$, 950 cm$^2$/V.sec., and 350 cm$^2$/V.sec. respectively.

EXAMPLE 10

As the substrate 103, an n$^+$-type Si-monocrystal wafer of 3 inches in diameter was used.

This substrate was firmly attached to the surface of the substrate holder 102. The air in the film forming chamber 101 was evacuated by opening the main valve 119 to bring the chamber to a vacuum of about $1 \times 10^{-6}$ Torr.

Then the heater 104 was activated to uniformly heat the substrate 103 to about 550° C. and it was kept at this temperature.

At the same time, H$_2$ gas as the active species B raw material from the gas reservoir 106 was fed through the feed pipe 110 into the active species B generation chamber 123 at a flow rate of 120 sccm. After the flow rate of the H$_2$ gas became stable, the microwave plasma generator 122 was switched on to apply a discharge energy into the inner space B whereby to generate an activated hydrogen as the active species B. The resulting activated hydrogen was then introduced through the active species B transporting conduit 124 into the film forming chamber 102.

In parallel, SiF$_4$ gas as the active species A raw material from a reservoir (not shown) was blown at a flow rate of 50 sccm through the gas supplying pipe 115 into Si solid particles 114 being stored in the active species A generation chamber 112 which was being kept at 1100° C. by the action of the infrared heating furnace whereby to generate SiF$_2$* as the active species A followed by introducing it through the active species transporting conduit 116 into the film forming chamber 101. And the formation of a silicon containing deposited epitaxial film on the foregoing substrate was carried out under the reduced inner pressure condition of 0.3 Torr.

The film forming speed in this case was 15 μm/hr. The resulting non-doped silicon-containing film was subjected to X-ray diffraction analysis by X-ray diffractometer. As a result, it was found that there had occurred a crystal growth of the same crystal face (100) as that of the Si-monocrystal wafer as the substrate and it had a slight grid defect.

And, as a result of observing the surface state of the film by scanning electron microscope, it was found that it was of excellent smoothness without any undesirable wave pattern, and the unevenness of its thickness was less than ±5%.

Then, a schottky electrode was prepared by forming an Au-thin layer of 0.5 mmφ in accordance with the conventional vacuum deposition process. When a predetermined voltage was impressed from the reverse side of the substrate to make the shottky electrode to be of reverse bias, and its carrier density at room temperature was measured according to Capacitance - Voltage method, the value was about $4.5 \times 10^{13}$ cm$^{-3}$.

As a result, it was found that the foregoing nondoped silicon-containing film was of excellent film quality.

EXAMPLE 11

The procedures of Example 10 were repeated, except that a silica glass of 5 cm × 5 cm in size was used in stead of the n$^+$-type Si-monocrystal wafer as the substrate, the flow rate of H$_2$ gas was changed to 250 sccm and the temperature of the substrate was changed 650° C., to thereby obtain a deposited film.

The resulting film was subjected to X-ray diffraction analysis in accordance with the same procedures as in Example 1, and it was found that an expitaxial film having the (100) crystal face had been formed on the substrate. It was also found that the unevenness of the thickness of the film was less than ±5%.

Further, when the situations of the carrier density, electron mobility and hole mobility on the resulting film were measured by van der Pauw method, the values for them were about $8.5 \times 10^{13}$ cm$^{-3}$, 1100 cm$^2$/V.sec., and 410 cm$^2$/V.sec. respectively.

EXAMPLE 12

The procedures of Example 10 were repeated, except that the flow rate of SiF$_4$ was changed to 60 sccm from 50 sccm and B$_2$H$_6$/H$_2$ gas (content of B$_2$H$_6$: 1000 ppm) from the gas reservoir 107 was fed at the flow rates of 5 sccm, 40 sccm and 250 sccm respectively into the active species B generation chamber 123 in addition to H$_2$ gas, to thereby form three kinds of deposited films respectively.

In that case, the doping efficiency at room temperature on the resulting deposited films was examined in accordance with van der Pauw method. The results were as shown in Table 5. According to the results of Table 5, it was found that any of the deposited films had been effectively doped with the p-type dopant.

TABLE 5

| The kind and flow rate of gaseous dopant | σd (S · cm$^{-1}$) | Hole mobility (cm$^2$/V · sec) | Carrier density (cm$^{-3}$) |
|---|---|---|---|
| B$_2$H$_6$ (1000 ppm, diluted with H$_2$) 5 sccm | $2.0 \times 10^{-3}$ | 180 | $5.5 \times 10^{16}$ |
| B$_2$H$_6$ (1000 ppm, diluted with H$_2$) 40 sccm | $4.0 \times 10^{-2}$ | 100 | $6.5 \times 10^{17}$ |
| B$_2$H$_6$ (1000 ppm, diluted with H$_2$) 250 sccm | $2.5 \times 10^{-1}$ | 40 | $8.5 \times 10^{18}$ |

EXAMPLE 13

The procedures of Example 10 were repeated, except that a p$^+$-type Si-monocrystal wafer plate was used in stead of the n$^+$-type Si-monocrystal wafer and PH$_3$/H$_2$ gas (content of PH$_3$: 1000 ppm) was fed at the flow rates of 5 sccm, 40 sccm and 300 sccm respectively into the active species generation chamber 123 in addition to H$_2$ gas, to thereby form three kinds of deposited films respectively.

In that case, the doping efficiency of room temperature on the resulting deposited films was examined in accordance with van der Pauw method. The results were as shown in Table 6. According to the results of Table 6, it was found that any of the deposited films had been effectively doped with the n-type dopant.

TABLE 6

| The kind and flow rate of gaseous dopant | σd (S · cm$^{-1}$) | Electron mobility (cm$^2$/V · sec) | Carrier density (cm$^{-3}$) |
|---|---|---|---|
| PH$_3$ (1000 ppm, diluted with H$_2$) | $3.0 \times 10^{-3}$ | 800 | $4.5 \times 10^{16}$ |

TABLE 6-continued

| The kind and flow rate of gaseous dopant | σd (S · cm⁻¹) | Electron mobility (cm²/V · sec) | Carrier density (cm⁻³) |
|---|---|---|---|
| 5 sccm PH₃ (1000 ppm, diluted with H₂) 40 sccm | $5.5 \times 10^{-2}$ | 650 | $7.5 \times 10^{17}$ |
| PH₃ (1000 ppm, diluted with H₂) 300 sccm | $3.0 \times 10^{-1}$ | 110 | $9.0 \times 10^{18}$ |

EXAMPLE 14

As the substrate 103, an n+-type GaAs-monocrystal wafer of 2 inches in diameter was used.

This substrate was firmly attached to the surface of the substrate holder 102. The air in the film forming chamber was evacuated by opening the main valve 119 to bring the chamber to a vacuum of about $1 \times 10^{-6}$ Torr.

Then the heater 104 was activated to uniformly heat the substrate 103 to about 400° C. and it was kept at this temperature.

At the same time, H₂ gas as the active species B raw material from the gas reservoir 106 was fed through the feed pipe 110 into the active species B generation chamber 123 at a flow rate of 150 sccm. After the flow rate of the H₂ gas became stable, the microwave plasma generator 122 was switched on to apply a discharge energy into the inner space B whereby to generate an activated hydrogen as the active species B. The resulting activated hydrogen was then introduced through the active species B transporting conduit 124 into the film forming chamber 102.

In parallel, GeF₄ gas as the active species A raw material from a reservoir (not shown) was blown at a flow rate of 40 sccm through the gas supplying pipe 115 into Si solid particles 114 being stored in the active species A generation chamber 112 not containing any particles and GeF₄ gas was activated by the action of the microwave plasma generation means whereby to generate GeF₂* as the active species A followed by introducing it through the active species A transporting conduit 116 into the film forming chamber 101. And the formation of a germanium containing deposited epitaxial film on the foregoing substrate was carried out under the reduced inner pressure condition of 0.3 Torr.

The film forming speed in this case was 7 μm/hr. The resulting non-doped germanium-containing film was subjected to X-ray diffraction analysis by X-ray diffractometer. As a result, it was found that there had occurred a crystal growth of the same crystal face (100) as that of the GaAs-monocrystal wafer as the substrate and it had a slight grid defect.

And, as a result of observing the surface state of the film using scanning electron microscope, it was found that it was of excellent smoothness without any undesirable wave pattern and the unevenness of its thickness was less than ±5%.

Then, a schottky electrode was prepared by forming an Au-thin layer of 0.5 mmφ on the surface of the above film in accordance with the conventional vacuum deposition process. When a predetermined voltage was impressed from the reverse side of the substrate to make the shottky electrode to be of reverse bias, and its carrier density at room temperature was measured according to Capacitance - Voltage method, the value was about $7.0 \times 10^{13}$ cm⁻³.

As a result, it was found that the foregoing nondoped germanium-containing film was of excellent film quality.

EXAMPLE 15

The procedures of Example 14 were repeated, except that a silica glass of 5 cm ×5 cm in size was used instead of the n+-type GaAs-monocrystal wafer as the substrate, the flow rate of H₂ gas was changed to 200 sccm and the temperature of the substrate was changed 450° C., to thereby obtain a deposited film.

The resulting film was subjected to X-ray diffraction analysis in accordance with the same procedures as in Example 1, and it was found that an expitaxial film having the (100) crystal face had been formed on the substrate. It was also found that the unevenness of the thickness of the film was less than ±5%.

Further, when the situations of the carrier density, electron mobility and hole mobility on the resulting film were measured by van der Pauw method, the values for them were about $8.5 \times 10^{13}$ cm⁻¹, 3100 cm²/V.sec., and 1000 cm²/V.sec. respectively.

EXAMPLE 16

The procedures of Example 14 were repeated, except that the flow rate of SiF₄ was changed to 50 sccm from 40 sccm and B₂H₆/H₂ gas (content of B₂H₆: 1000 ppm) from the gas reservoir 107 was fed at the flow rates of 5 sccm, 40 sccm and 250 sccm respectively into the active species B generation chamber 123 in addition to H₂ gas, to thereby form three kinds of deposited films respectively.

In that case, the doping efficiency at room temperature on the resulting deposited films was examined in accordance with van der Pauw method. The results were as shown in Table 7. According to the results of Table 7, it was found that any of the deposited films had been effectively doped with the p-type dopant.

TABLE 7

| The kind and flow rate of gaseous dopant | σd (S · cm⁻¹) | Hole mobility (cm²/V · sec) | Carrier density (cm⁻³) |
|---|---|---|---|
| B₂H₆ (1000 ppm, diluted with H₂) 5 sccm | 5.5 | 780 | $8.0 \times 10^{16}$ |
| B₂H₆ (1000 ppm, diluted with H₂) 40 sccm | $6.5 \times 10^{1}$ | 600 | $8.5 \times 10^{17}$ |
| B₂H₆ (1000 ppm, diluted with H₂) 250 sccm | $5.5 \times 10^{2}$ | 350 | $1.0 \times 10^{19}$ |

EXAMPLE 17

The procedures of Example 14 were repeated, except that a p+-type GaAs-monocrystal wafer plate was used in stead of the n+-type GaAs-monocrystal wafer plate as the substrate, and PH₃/H₂ gas (content of PH₃: 1000 ppm) was fed at the flow rates of 5 sccm, 45 sccm and 300 sccm respectively into the active species B generation chamber 123 in addition to H₂ gas, to thereby form three kinds of deposited films respectively.

In that case, the doping efficiency at room temperature on the resulting deposited films was examined in accordance with van der Pauw method. The results were as shown in Table 8. According to the results of Table 8, it was found that any of the deposited films had been effectively doped with the n-type dopant.

TABLE 8

| The kind and flow rate of gaseous dopant | $\sigma d$ (S · cm$^{-1}$) | Electron mobility (cm$^2$/V · sec) | Carrier density (cm$^{-3}$) |
|---|---|---|---|
| PH$_3$ (1000 ppm, diluted with H$_2$) 5 sccm | 6.5 | 2400 | 8.5 × 10$^{16}$ |
| PH$_3$ (1000 ppm, diluted with H$_2$) 45 sccm | 7.0 × 10$^1$ | 1800 | 9.0 × 10$^{17}$ |
| PH$_3$ (1000 ppm, diluted with H$_2$) 300 sccm | 5.0 × 10$^2$ | 700 | 1.5 × 10$^{19}$ |

EXAMPLE 18

The procedures of Example 10 were repeated, except that a silica glass of 5 cm × 5 cm in size having an n$^+$-type poly-Si layer of 5 μm in thickness was used in stead of the n$^+$-type Si-monocrystal wafer plate as the substrate, the flow rate of H$_2$ was changed to 140 sccm and the temperature of the substrate was changed to 600° C., whereby to obtain a deposited film.

The resulting film was subjected to electron diffraction analysis in accordance with the RHEED Pattern using the conventional electron diffractograph, and it was found that an epitaxial film having the (100) crystal face of silicon had been formed on the substrate. It was also found that the unevenness of the film was less than ±5%.

Further, when the situations of carrier density, electron mobility and hole mobility on the film were measured by van der Pauw method, the values were about 9.0×10$^{13}$cm$^{-3}$, 100 cm$^2$/V.sec., and 380 cm$^2$/V.sec. respectively.

EXAMPLE 19

In this example, the apparatus of FIG. 2 was used. As the substrate 103, a silica glass of 10 cm × 10 cm in size was used.

This substrate was firmly attached to the surface of the substrate holder 102. The air in the film forming chamber was evacuated by opening the main valve 119 to bring the chamber to a vacuum of about 1×10$^{-6}$ Torr.

At the same time, H$_2$ gas from the gas reservoir 106 and B$_2$H$_6$/H$_2$ gas (content of B$_2$H$_6$: 1500 ppm) from the gas reservoir 107 were fed through the feed pipe 110 into the active species B generation chamber 123 at a flow rate of 100 sccm and 3 sccm respectively. After the flow rate at least of the H$_2$ gas became stable, the microwave plasma generator 122 was switched on to apply a discharge energy into the inner space B whereby to generate an activated hydrogen as the active species B. The resulting activated hydrogen was then introduced through the active species B transporting conduit 124 into the film forming chamber 102.

In parallel, SiF$_4$ gas as the active species A raw material from a reservoir (not shown) was blown at a flow rate of 30 sccm through the gas supplying pipe 115 into Si solid particles 114 being stored in the active species A generation chamber 112 which was being kept at about 1100° C. by the action of the infrared heating furnace whereby to generate SiF$_2$* as the active species A followed by introducing it through the active species transporting conduit 116 into the film forming chamber 101. And the formation of a silicon containing deposited epitaxial film on the foregoing substrate was carried out under the reduced inner pressure condition of 0.4 Torr.

At the same time when the film formation started, laser beam generated by a ruby laser 118 (wave length: 694 nm, beam diameter: 10 mm) placed over the film forming chamber 101 was irradiated to the surface of the substrate at an energy density of 1J/cm$^3$ and a pulse width of 40 nS while the substrate holder 102 being horizontally moved at a speed of 1 cm/sec., and under this condition the film forming operation was continued for 30 minutes. The resulting deposited film sample by the above procedures was indicated by "Sample No. 19-1" in the following Table 9.

Then, Samples Nos. 19-2 and 19-3 were separately prepared by repeating the above procedures except changing the flow rate for the B$_2$H$_6$ gas to 30 sccm and 300 sccm respectively.

Further, Samples Nos. 19-4, 19-5 and 19-6 were separately prepared by repeating the above procedures except changing the energy density to 2J/cm$^3$.

The resulting deposited film samples were subjected to the foregoing X-ray diffraction analysis and electron diffraction analysis. As a result, it was found that the deposited films of Sample Nos. 19-1, 19-2 and 19-3 were polycrystalline silicon-containing films and the deposited films of Sample Nos. 19-4, 19-5 and 19-6 were epitaxial films whose surface parallel to the substrate surface having an orientation close to the crystal face (100).

Further, as a result of observing the state of the particle size on these samples in accordance with Scherrar method, it was found that the particle size on each of the polycrystalline films was about 4 μm. As for the epitaxial films, any unevenness in particle size was not observed on any of them.

And, as a result of observing the surface state of each of the samples by scanning electron microscope, it was found that each of them was of excellent smoothness without any undesirable wave pattern, and the unevenness in thickness was less than ±5% for any of them.

In addition, the layer thickness of them was about 7 μm respectively.

Further, the results of observing the doping efficiency for each of the samples in accordance with van der Pauw were as shown in Table 9.

According to the results of Table 9, it was found that any of the samples had been effectively doped with the dopant.

TABLE 9

| Sample No. | The kind & flow rate of gaseous dopant | $\sigma d$ (S · cm$^{-1}$) | Hole mobility (cm$^2$/V · sec) | Carrier density (cm$^{-3}$) |
|---|---|---|---|---|
| 19-1 | B$_2$H$_6$ (1500 ppm, diluted with H$_2$) 3 sccm | 7.5 × 10$^{-8}$ | 90 | 2.5 × 10$^{18}$ |
| 19-2 | B$_2$H$_6$ (1500 ppm, diluted with H$_2$) 30 sccm | 6.5 × 10$^{-7}$ | 40 | 3.0 × 10$^{19}$ |
| 19-3 | B$_2$H$_6$ (1500 ppm, diluted with | 8.0 × 10$^{-6}$ | 15 | 2.0 × 10$^{20}$ |

TABLE 9-continued

| Sample No. | The kind & flow rate of gaseous dopant | σd (S·cm$^{-1}$) | Hole mobility (cm$^2$/V·sec) | Carrier density (cm$^{-3}$) |
|---|---|---|---|---|
| | H$_2$) 300 sccm | | | |
| 19-4 | B$_2$H$_6$ (1500 ppm, diluted with H$_2$) 3 sccm | 7.0 × 10$^{-4}$ | 330 | 3.0 × 10$^{16}$ |
| 19-5 | B$_2$H$_6$ (1500 ppm, diluted with H$_2$) 30 sccm | 5.0 × 10$^{-3}$ | 240 | 2.5 × 10$^{17}$ |
| 19-6 | B$_2$H$_6$ (1500 ppm, diluted with H$_2$) 300 sccm | 7.5 × 10$^{-2}$ | 100 | 1.5 × 10$^{18}$ |

EXAMPLE 20

The procedures of Example 19 were repeated, except that a p$^+$-type Si-monocrystal wafer plate was used in place of the silica glass, and PH$_3$/H$_2$ gas (content of PH$_3$: 2000 ppm) from the gas reservoir 108 instead of the B$_2$H$_6$/H$_2$ gas was at 4 sccm, 50 sccm and 250 sccm respectively into the film forming chamber 101, to thereby obtain deposited films to be Sample Nos. 20-1, 20-2, 20-3, 20-4, 20-5 and 20-6 respectively.

Wherein, the doping efficiency at room temperature was examined on each of the samples in accordance with van der Pauw. The results were as shown in the following Table 10.

According to the results of Table 10, it was found that any of the samples had been effectively doped with the dopant.

Further, as for the case that the energy density was different as in Example 19, it was found that the samples of Nos. 20-1, 20-2 and 20-3 were polycrystalline silicon-containing films and the samples of Nos. 20-4 20-5 and 20-6 were epitaxial silicon-containing films.

TABLE 10

| Sample No. | The kind & flow rate of gaseous dopant | σd (S·cm$^{-1}$) | Electron mobility (cm$^2$/V·sec) | Carrier density (cm$^{-3}$) |
|---|---|---|---|---|
| 20-1 | PH$_3$ (2000 ppm, diluted with H$_2$) 4 sccm | 6.5 × 10$^{-8}$ | 200 | 4.0 × 10$^{18}$ |
| 20-2 | PH$_3$ (2000 ppm, diluted with H$_2$) 50 sccm | 5.0 × 10$^{-7}$ | 70 | 3.5 × 10$^{19}$ |
| 20-3 | PH$_3$ (2000 ppm, diluted with H$_2$) 250 sccm | 7.0 × 10$^{-6}$ | 30 | 2.5 × 10$^{20}$ |
| 20-4 | PH$_3$ (2000 ppm, diluted with H$_2$) 4 sccm | 6.5 × 10$^{-4}$ | 800 | 5.0 × 10$^{16}$ |
| 20-5 | PH$_3$ (2000 ppm, diluted with H$_2$) 50 sccm | 4.0 × 10$^{-3}$ | 500 | 3.0 × 10$^{17}$ |
| 20-6 | PH$_3$ (2000 ppm, diluted with H$_2$) 250 sccm | 6.0 × 10$^{-2}$ | 250 | 2.5 × 10$^{18}$ |

EXAMPLE 21

In the procedures of Example 19, a Al$_2$O$_3$ plate was used in stead of the silica glass plate, the flow rate of the H$_2$ gas was changed to 120 sccm and the temperature of the substrate was changed to 180° C.

Further, GeF$_4$ gas from the reservoir 109 was fed at a flow rate of 40 sccm into the active species A generation chamber 112 without having any solid particle and the GeF$_4$ gas was activated by the action of the microwave plasma generating means 113 to produce GeF$_2$* followed by introducing it through the active species B transporting conduit 116 into the film forming chamber 101. In addition, a halogen lamp was used in stead of the ruby laser to activate the substrate surface.

And, for preparing samples of Sample Nos. 21-1, 21-2 and 21-3 the substrates for them were irradiated with a lamp power of 4.5 kW intermittently at 45 seconds intervals, and for preparing samples of Sample Nos. 21-4, 21-5 and 21-6, the substrates for them were irradiated with a lamp power of 18 kW intermittently at 45 seconds intervals.

The film forming operation for each sample was carried out for 20 minutes. And the layer thickness of any of the resulting samples was about 4 μm.

The resulting deposited film samples were subjected to the foregoing X-ray diffraction analysis and electron diffraction analysis.

As a result, it was found that the deposited films of Sample Nos. 21-1, 21-2 and 21-3 were polycrystal germanium-containing films and the deposited films of Sample Nos. 21-4, 21-5 and 21-6 were epitaxial films whose surface parallel to the substrate surface having an orientation close to the crystal face (100).

Further, as a result of observing the state of the particle size on these samples in accordance with Scherrar method, it was found that the particle size on each of the polycrystal films was about 5.5 μm. As for the epitaxial films, any unevenness in particle size was not observed on each of them.

And, as a result of observing the surface state of each of the samples by scanning electron microscope, it was found that each of them was of excellent smoothness without any undesirable wave pattern, and the unevenness in thickness was less than ±5% for any of them.

Further, the results of observing the doping efficiency for each of the samples in accordance with van der Pauw were as shown in Table 11.

According to the results of Table 11, it was found that any of the samples had been effectively doped with the dopant.

In addition, it was found that either a polycrystalline germanium containing film or an epitaxial germanium containing film can be optionally obtained by changing the lamp power of the halogen lamp properly.

TABLE 11

| Sample No. | The kind & flow rate of gaseous dopant | $\sigma d$ (S·cm$^{-1}$) | Hole mobility (cm$^2$/V·sec) | Carrier density (cm$^{-3}$) |
|---|---|---|---|---|
| 21-1 | B$_2$H$_6$ (1500 ppm, diluted with H$_2$) 3 sccm | $3.0 \times 10^{-3}$ | 150 | $3.5 \times 10^{18}$ |
| 21-2 | B$_2$H$_6$ (1500 ppm, diluted with H$_2$) 30 sccm | $2.0 \times 10^{-2}$ | 60 | $4.5 \times 10^{19}$ |
| 21-3 | B$_2$H$_6$ (1500 ppm, diluted with H$_2$) 300 sccm | $4.0 \times 10^{-1}$ | 15 | $6.0 \times 10^{20}$ |
| 21-4 | B$_2$H$_6$ (1500 ppm, diluted with H$_2$) 3 sccm | 3.5 | 1000 | $5.0 \times 10^{16}$ |
| 21-5 | B$_2$H$_6$ (1500 ppm, diluted with H$_2$) 30 sccm | $1.5 \times 10^1$ | 650 | $6.5 \times 10^{17}$ |
| 21-6 | B$_2$H$_6$ (1500 ppm, diluted with H$_2$) 300 sccm | $2.0 \times 10^2$ | 200 | $4.5 \times 10^{18}$ |

EXAMPLE 22

In Example 21, except that a p$^+$-type GaAs monocrystal wafer plate was used instead of the Al$_2$O$_3$ plate, the flow rate of GeF$_4$ was changed to 50 sccm and PH$_3$/H$_2$ gas (content of PH$_3$: 2000 ppm) instead of the B$_2$H$_6$/H$_2$ gas was fed at a flow rate of 3 sccm, 40 sccm and 200 sccm respectively, the same procedures were repeated to obtain deposited films (Sample Nos. 22-1, 22-2, 22-3, 22-4, 22-5 and 22-6).

As a result that the doping efficiency at room temperature was examined on each of the samples in accordance with van der Pauw method, the results as shown in Table 12 were obtained. According to the results of Table 12, it was found that any of the samples had been effectively doped with the n-type dopant.

It was then found that either polycrystalline germanium-containing film or an epitaxial germanium-containing film can be optionally formed by changing the lamp power of the halogen lamp.

TABLE 12

| Sample No. | The kind & flow rate of gaseous dopant | $\sigma d$ (S·cm$^{-1}$) | Electron mobility (cm$^2$/V·sec) | Carrier density (cm$^{-3}$) |
|---|---|---|---|---|
| 22-1 | PH$_3$ (2000 ppm, diluted with H$_2$) 3 sccm | $4.0 \times 10^{-3}$ | 350 | $3.0 \times 10^{18}$ |
| 22-2 | PH$_3$ (2000 ppm, diluted with H$_2$) 40 sccm | $3.5 \times 10^{-2}$ | 150 | $5.0 \times 10^{19}$ |
| 22-3 | PH$_3$ 2000 ppm, diluted with H$_2$) 200 sccm | $3.0 \times 10^{-1}$ | 35 | $5.5 \times 10^{20}$ |
| 22-4 | PH$_3$ (2000 ppm, diluted with H$_2$) 3 sccm | 4.0 | 2800 | $4.5 \times 10^{16}$ |
| 22-5 | PH$_3$ (2000 ppm, diluted with H$_2$) 40 sccm | $2.0 \times 10^1$ | 1900 | $6.0 \times 10^{17}$ |
| 22-6 | PH$_3$ (2000 ppm, diluted with H$_2$) 200 sccm | $3.0 \times 10^2$ | 600 | $4.0 \times 10^{18}$ |

What we claim is:

1. A process for forming a functional epitaxial film on a substrate having a surface formed of a single crystal material of specific crystal orientation in a film deposition chamber, comprising the steps of:
   (i) generating an active species (A) by supplying an excitation energy to a raw material gas containing halogen and silicon or germanium in a chamber (A) for the generation of said active species (A);
   (ii) generating an active species (B) by supplying an excitation energy to H$_2$ gas in a chamber (B) for the generation of said active species (B); and
   (iii) separately introducing said active species (A) and said active species (B) into said film deposition chamber at a flow ratio of 20:1 to 1:20 to mix and chemically react in a space open to said surface of said substrate being maintained at a temperature of 250° to 800° C. and under reduced pressure and to thereby form a functional epitaxial film on said surface of said substrate, said epitaxial film having the same crystal orientation as said substrate.

2. A process for forming a functional epitaxial film according to claim 1, wherein said raw material is selected from the group consisting of SiF$_4$, (SiF$_2$)$_4$, (SiF$_2$)$_5$, (SiF$_2$)$_6$, Si$_2$F$_6$, Si$_3$F$_8$, Si$_4$F$_{10}$, SiHF$_3$, SiH$_2$F$_2$, SiH$_3$F, SiCl$_4$, (SiCl$_2$)$_5$, SiBr$_4$, (SiBr$_2$)$_5$, Si$_2$Cl$_6$, Si$_3$Cl$_8$, Si$_2$Br$_6$, Si$_3$Br$_8$, SiHCl$_3$, SiH$_2$Cl$_2$, SiHBr$_3$, SiH$_2$Br$_2$, SiHI$_3$, SiH$_2$I$_2$, Si$_2$H$_3$F$_3$ and Si$_2$Cl$_3$F$_3$, 3. A process for forming a functional epitaxial film according to claim 2, wherein the chemical reaction between said active species (A) and said active species (B) is carried out while the substrate is maintained at a temperature of 200° C. to 900° C.

4. A process for forming a functional epitaxial film according to claim 1, wherein said raw material is a member selected from the group consisting of GeF$_4$, (GeF$_2$)$_4$, (GeF$_2$)$_5$, (GeF$_2$)$_6$, Ge$_2$F$_6$, Ge$_3$F$_8$, GeHF$_3$, GeH$_2$F$_2$, GeH$_3$F, GeCl$_4$, (GeCl$_2$)$_5$, GeBr$_4$, (GeBr$_2$)$_5$, Ge$_2$Cl$_6$, Ge$_2$Br$_6$, GeHCl$_3$, GeHBr$_3$, GeHI$_3$, Ge$_2$H$_3$F$_3$, and Ge$_2$Cl$_3$F$_3$.

5. A process for forming a functional epitaxial film according to claim 4, wherein the chemical reaction between said active species (A) and said active species (B) is carried out while the substrate is maintained at a temperature of 150° C. to 700° C.

6. A process for forming a functional epitaxial film according to claim 1, which further comprises generating an impurity imparting active species by supplying an excitation energy to an impurity imparting raw material in a chamber for the generation of said impurity imparting active species and introducing the impurity imparting active species into said film deposition chamber.

7. A process for forming a functional epitaxial film according to claim 6, wherein said impurity imparting raw material is selected from the group consisting of $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $Bf_3$, $BCl_3$, $BBr_3$, $B_2H_6$, $B_4H_{10}$, $B_5H_9$, $B_5H_{11}$, $B_6H_{10}$, $B_6H_{12}$ and $AlCl_3$.

8. A process for forming a functional epitaxial film on a substrate having a surface formed of a single crystal material of specific crystal orientation in a film deposition chamber, comprising the steps of:
 (i) generating an active species (A) by supplying an excitation energy to a mixture of a raw material gas containing halogen and silicon or germanium and an impurity imparting raw material gas in an active species generation chamber (A);
 (ii) generating an active species (B) by supplying an excitation energy to $H_2$ gas in an active species generation chamber (B); and
 (iii) separately introducing said active species (A) and said active species (B) into said film deposition chamber at a flow ratio if 20:1 to 1:20 to mix and chemically react in a space open to said surface of said substrate being maintained at a temperature of 250° to 800° C. and under reduced pressure and to thereby form a functional epitaxial film on said surface of said substrate, said epitaxial film having the same crystal orientation as said substrate.

9. A process for forming a functional epitaxial film on a substrate having a surface formed of a single crystal material of specific crystal orientation in a film deposition chamber, comprising the steps of:
 (i) generating an active species (A) by supplying an excitation energy to a raw material gas containing halogen and silicon or germanium in a chamber (A) for the generation of said active species (A);
 (ii) generating an active species (B) by supplying an excitation energy to a mixture of $H_2$ gas and an impurity imparting raw material gas in a chamber (B) for the generation of said active species (B); and
 (iii) separately introducing said active species (A) and said active species (B) into said film deposition chamber at a flow ratio of 20:1 to 1:20 to mix and chemically react in a space open to said surface of said substrate being maintained at a temperature of 250° to 800° C. and under reduced pressure and to thereby form a functional epitaxial film on said surface of said substrate, said epitaxial film having the same crystal orientation as said substrate.

10. A process for forming a functional epitaxial film on a substrate having a surface formed of a single crystal material of specific crystal orientation in a film deposition chamber, comprising the steps of:
 (i) generating an active species (A) by supplying an excitation energy to a raw material gas containing halogen and silicon or germanium in a chamber (A) for the generation of said active species (A);
 (ii) generating an active species (B) by supplying an excitation energy to $H_2$ gas in a chamber (B) for the generation of said active species (B); and
 (iii) separately introducing said active species (A) and said active species (B) into said film deposition chamber at a flow ratio of 20:1 to 1:20 to mix and chemically react in a space open to said surface of said substrate being maintained at a temperature of 250° to 800° C. and under reduced pressure while an excitation energy selected from light energy and heat energy is introduced into said film deposition chamber to thereby promote formation of a functional epitaxial film on said surface of said substrate, said epitaxial film having the same crystal orientation as said substrate.

11. A process for forming a functional epitaxial film according to claim 10, wherein said raw material is selected from the group consisting of $SiF_4$, $(SiF_2)_4$, $(SiF_2)_5$, $(SiF_2)_6$, $Si_2F_6$, $Si_3F_8$, $Si_4F_{10}$, $SiHF_3$, $SiH_2F_2$, $SiH_3F$, $SiCl_4$, $(SiCl_2)_5$, $SiBr_4$, $(SiBr_2)_5$, $Si_2Cl_6$, $Si_3Cl_8$, $Si_2Br_6$, $Si_3Br_8$, $SiHCl_3$, $SiH_2Cl_2$, $SiHBr_3$, $SiH_2Br_2$, $SiHI_3$, $SiH_2I_2$, $Si_2H_3F_3$ and $Si_2Cl_3F_3$.

12. A process for forming a functional epitaxial film according to claim 11, wherein the chemical reaction between said active species (A) and said active species (B) is carried out while the substrate is maintained at a temperature of 200° C. to 900° C.

13. A process for forming a functional epitaxial film according to claim 10, wherein said raw material is selected from the group consisting of $GeF_4$, $(GeF_2)_4$, $(GeF_2)_5$, $(GeF_2)_6$, $Ge_2F_6$, $Ge_3F_8$, $GeHF_3$, $GeH_2F_2$, $GeH_3F$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, $Ge_2H_3F_3$ and $Ge_2Cl_3F_3$.

14. A process for forming a functional epitaxial film according to claim 13, wherein the chemical reaction between said active species (A) and said active species (B) is carried out while the substrate is maintained at a temperature of 150° C. to 700° C.

15. A process for forming a functional epitaxial film according to claim 10, which further comprises generating an impurity imparting active species by supplying an excitation energy to an impurity imparting raw material in a chamber for the generation of said impurity imparting species and introducing the impurity imparting active species into said film deposition chamber.

16. A process for forming a functional epitaxial film according to claim 15, wherein said impurity imparting raw material is selected from the group consisting of $PH_3$, $P_2H_4$, $PF_3$, $PF_5$, $PCl_3$, $AsH_3$, $AsF_3$, $AsF_5$, $AsCl_3$, $SbH_3$, $SbF_3$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$ and $AlCl_3$.

17. A process for forming a functional epitaxial film on a substrate having a surface formed of a single crystal material of specific crystal orientation in a film deposition chamber, comprising the steps of:
 (i) generating an active species (A) by supplying an excitation energy to a mixture of raw material gas containing halogen and silicon or germanium and an impurity imparting raw material gas in an active species generation chamber (A);
 (ii) generating an active species (B) by supplying an excitation energy to $H_2$ gas in an active species generation chamber (B); and
 (iii) separately introducing said active species (A) and said active species (B) into said film deposition chamber at a flow rate of 20:1 to 1:20 to mix and chemically react in a space open to said surface of said substrate being maintained at a temperature of 250° to 800° C. and under reduced pressure while an excitation energy selected from light energy and heat energy is introduced into said film deposition chamber to thereby promote formation of a functional epitaxial film on said surface of said substrate, said epitaxial film having the same crystal orientation as said substrate.

18. A process for forming a functional epitaxial film on a substrate having a surface formed of a single crystal material of specific crystal orientation in a film deposition chamber, comprising the steps of:

(i) generating an active species (A) by supplying an excitation energy to a raw material gas containing halogen and silicon or germanium in a chamber (A) for the generation of said active species (A);

(ii) generating an active species (B) by supplying an excitation energy to a mixture of $H_2$ gas and an impurity imparting raw material gas in a chamber (B) for the generation of said active species (B); and (iii) separately introducing said active species (A) and said active species (B) into said film deposition chamber at a flow ratio of 20:1 to 1:20 to mix and chemically react in a space open to said surface of said substrate being maintained at a temperature of 250° to 800° C. and under reduced pressure while an excitation energy selected from light energy and heat energy is introduced into said film deposition chamber to thereby form a functional epitaxial film on said surface of said substrate, said epitaxial film having the same crystal orientation as said substrate.

19. A process for forming a functional epitaxial film on a substrate having a surface formed of a single crystal material of specific crystal orientation in a film deposition chamber, comprising the steps of:

(i) generating an active species (A) by supplying an excitation energy to a raw material gas containing halogen and silicon or germanium in a chamber (A) for the generation of said species (A);

(ii) generating an active species (B) by supplying an excitation energy to $H_2$ gas in a chamber (B) for the generation of said active species (B);

(iii) separately introducing said active species (A) and said active species (B) into said film deposition chamber at a flow rate of 20:1 to 1:20 to mix and chemically react in a space open to said surface of said substrate being maintained at a temperature of 250° to 800° C. and under reduced pressure to thereby form a functional epitaxial film on said surface of said substrate; and (iv) subjecting the film being deposited on said substrate to heat treatment by introducing an excitation energy into said film deposition chamber to promote the formation of said epitaxial film, said epitaxial film having the same crystal orientation as said substrate.

20. A process for forming a functional epitaxial film according to claim 19, wherein a source for said excitation energy is selected from the group consisting of Ar laser, ruby laser, yag laser, excimer laser, electron beam, ion beam, high power lamp and high power electric heater.

21. The process for forming a functional epitaxial film according to claim 19, wherein said raw material is selected from the group consisting of $SiF_4$, $(SiF_2)_4$, $(SiF_2)_5$, $(SiF_2)_6$, $Si_2F_6$, $Si_3F_8$, $Si_4F_{10}$, $SiHF_3$, $SiH_2F_2$, $SiH_3F$, $SiCl_4$, $(SiCl_2)_5$, $SiBr_4$, $(SiBr_2)_5$, $Si_2Cl_6$, $Si_3Cl_8$, $Si_2Br_6$, $Si_3Br_8$, $SiHCl_3$, $SiH_2Cl_2$, $SiHBr_3$ $SiH_2BR_2$ $SiHI_3$, $SiH_2I_2$, $Si_2H_3F_3$ and $Si_2Cl_3F_3$.

22. A process for forming a functional epitaxial film according to claim 21, wherein the chemical reaction between said active species (A) and said active species (B) is carried out while the substrate is maintained at a temperature of 200° C. to 900° C.

23. A process for forming a functional epitaxial film according to claim 19, wherein said raw material is selected from the group consisting of $GeF_4$, $(GeF_2)_4$, $(GeF_2)_5$, $(GeF_2)_6$, $Ge_2F_6$, $Ge_3F_8$, $GeHF_3$, $GeH_2F_2$, $GeH_3F$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, $Ge_2H_3F_3$, and $Ge_2Cl_3F_3$.

24. A process for forming a functional epitaxial film according to claim 23, wherein the chemical reaction between said active species (A) and said active species (B) is carried out while the substrate is maintained at a temperature of 150° C. to 700° C.

25. A process for forming a functional epitaxial film according to claim 19, which further comprises generating an impurity imparting active species by supplying an excitation energy to an impurity imparting raw material in a chamber for the generation of said impurity imparting active species and introducing the impurity imparting active species into said film deposition chamber.

26. A process for forming a functional epitaxial film according to claim 25, wherein said impurity imparting raw material is selected from the group consisting of $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $BF_3$, $BCl_3$, $BBr_3$, $B_2H_6$, $B_4H_{10}$ $B_5H_9$, $B_5H_{11}$, $B_6H_{10}$, $B_6H_{12}$, and $AlCl_3$.

27. A process for forming a functional epitaxial film on a substrate having a surface formed of a single crystal material of specific crystal orientation in a film deposition chamber, comprising the steps of:

(i) generating an active species (A) by supplying an excitation energy to a mixture of a raw material gas containing halogen and silicon or germanium and an impurity imparting raw material gas in an active species generation chamber (A);

(ii) generating an active species (B) by supplying an excitation energy to $H_2$ gas in an active species generation chamber (B);

(iii) separately introducing said active species (A) and said active species (B) into said film deposition chamber at a flow ratio of 20:1 to 1:20 to mix and chemically react in a space open to said surface of said substrate being maintained at a temperature of 250° to 800° C. and under reduced pressure to thereby form a functional epitaxial film on said surface of said substrate; and (iv) subjecting the film being deposited on said substrate to heat treatment by introducing an excitation energy into said film deposition chamber to promote the formation of said epitaxial film, said epitaxial film having the same crystal orientation as said substrate.

28. A process for forming a functional epitaxial film on a substrate having a surface of a single crystal material of specific crystal orientation in a film deposition chamber, comprising the steps of:

(i) generating an active species (A) by supplying an excitation energy to a raw material gas containing halogen and silicon or germanium in a chamber (A) for the generation of said active species (A);

(ii) generating an active species (B) by supplying an excitation energy to a mixture of $H_2$ gas and an impurity imparting raw material gas in a chamber (B) for the generation of said active species (B);

(iii) separately introducing said active species (A) and said active species (B) into said film deposition chamber at a flow ratio of 20:1 to 1:20 to mix and chemically react in a space open to said surface of said substrate being maintained at a temperature of 250° to 800° C. and under reduced pressure to thereby form a functional epitaxial film on said surface of said substrate; and (iv) subjecting the film being deposited on said substrate to heat treatment by introducing an excitation energy into said film deposition chamber to promote the formation of said epitaxial film, said epitaxial film having the same crystal orientation as said substrate.

29. A process for forming a functional epitaxial film according to claim 1, wherein said single crystal material is selected from the group consisting of Si-single crystal wafer plate, GaAs-single crystal wafer plate, and sapphire single crystal plate.

30. A process for forming a functional epitaxial film according to claim 8, wherein said single crystal material is selected from the group consisting of Si-single crystal wafer plate, GaAs-single crystal wafer plate, and sapphire single crystal plate.

31. A process for forming a functional epitaxial film according to claim 9, wherein said single crystal material is selected from the group consisting of Sisingle crystal wafer plate, GaAs-single crystal wafer plate, and sapphire single crystal plate.

32. A process for forming a functional epitaxial film according to claim 10, wherein said single crystal material is selected from the group consisting of Si-single crystal wafer plate, GaAs-single crystal wafer plate, and sapphire single crystal plate.

33. A process for forming a functional epitaxial film according to claim 17, wherein said single crystal material is selected from the group consisting of Si-single crystal wafer plate, GaAs-single crystal wafer plate, and sapphire single crystal plate.

34. A process for forming a functional epitaxial film according to claim 19, wherein said single crystal material is selected from the group consisting of Si-single crystal wafer plate, GaAs-single crystal wafer plate, and sapphire single crystal plate.

35. A process for forming a functional epitaxial film according to claim 19, wherein said single crystal material is selected from the group consisting of Si-single crystal wafer plate, GaAs-single crystal wafer plate, and sapphire single crystal plate.

36. A process for forming a functional epitaxial film according to claim 27, wherein said single crystal material is selected from the group consisting of Si-single crystal wafer plate, GaAs-single crystal wafer plate, and sapphire single crystal plate.

37. A process for forming a functional epitaxial film according to claim 28, wherein said single crystal material is selected from the group consisting of Si-single crystal wafer plate, GaAs-single crystal wafer plate, and sapphire single crystal plate.

38. The process according to claim 1, wherein said functional epitaxial film is a silicon-containing functional epitaxial film and said surface of said substrate is maintained at a temperature of 300° to 800° C.

39. The process according to claim 1, wherein said functional epitaxial film is a germanium-containing functional epitaxial film and said surface of said substrate is maintained at a temperature of 250° to 600° C.

40. The process according to claim 8, wherein said functional epitaxial film is a silicon-containing functional epitaxial film and said surface of said substrate is maintained at a temperature of 300° to 800° C.

41. The process according to claim 8, wherein said functional epitaxial film is a germanium-containing functional epitaxial film and said surface of said substrate is maintained at a temperature of 250° to 600° C.

42. The process according to claim 9, wherein said functional epitaxial film is a silicon-containing functional epitaxial film and said surface of said substrate is maintained at a temperature of 300° to 800° C.

43. The process according to claim 9, wherein said functional epitaxial film is a germanium-containing functional epitaxial film and said surface of said substrate is maintained at a temperature of 250° to 600° C.

44. The process according to claim 10, wherein said functional epitaxial film is a silicon-containing functional epitaxial film and said surface of said substrate is maintained at a temperature of 300° to 800° C.

45. The process according to claim 10, wherein said functional epitaxial film is a germanium-containing functional epitaxial film and said surface of said substrate is maintained at a temperature of 250° to 650° C.

46. The process according to claim 17, wherein said functional epitaxial film is a silicon-containing functional epitaxial film and said surface of said substrate is maintained at a temperature of 300° to 800° C.

47. The process according to claim 17, wherein said functional epitaxial film is a germanium-containing functional epitaxial film and said surface of said substrate is maintained at a temperature of 250° to 600° C.

48. The process according to claim 18, wherein said functional epitaxial film is a silicon-containing functional epitaxial film and said surface of said substrate is maintained at a temperature of 300° to 800° C.

49. The process according to claim 18, wherein said functional epitaxial film is a germanium-containing functional epitaxial film and said surface of said substrate is maintained at a temperature of 250° to 650° C.

50. The process according to claim 19, wherein said functional epitaxial film is a silicon-containing functional epitaxial film and said surface of said substrate is maintained at a temperature of 300° to 800° C.

51. The process according to claim 19, wherein said functional epitaxial film is a germanium-containing functional epitaxial film and said surface of said substrate is maintained at a temperature of 250° to 600° C.

52. The process according to claim 27, wherein said functional epitaxial film is a silicon-containing functional epitaxial film and said surface of said substrate is maintained at a temperature of 300° to 800° C.

53. The process according to claim 27, wherein said functional epitaxial film is a germanium-containing functional epitaxial film and said surface of said substrate is maintained at a temperature of 250° to 600° C.

54. The process according to claim 28, wherein said functional epitaxial film is a silicon-containing functional epitaxial film and said surface of said substrate is maintained at a temperature of 300° to 800° C.

55. The process according to claim 28, wherein said functional epitaxial film is a germanium-containing functional epitaxial film and said surface of said substrate is maintained at a temperature of 250° to 600° C.

* * * * *

UNITED STATES PATENT AND TRADEMARK OFFICE
CERTIFICATE OF CORRECTION

PATENT NO. : 5,294,285
DATED : March 15, 1994
INVENTOR(S) : MASAHIRO KANAI, ET AL.

Page 1 of 5

It is certified that error appears in the above-identified patent and that said Letters Patent is hereby corrected as shown below:

ON TITLE PAGE

In [56] References Cited, under FOREIGN PATENT DOCUMENTS:
"1194818" should read --61-194818--;
"1194820" should read --61-194820--;
"1194823" should read --61-194823--;
"1194824" should read --61-194824--.

COLUMN 1

Line 15, "electrophotography etc." should read --electrophotography, etc.--.
Line 22, "method" should read --methods--.

COLUMN 2

Line 36, "influences brought about" should be deleted.
Line 66, "of being" should be deleted.

COLUMN 3

Line 47, "practically" should read --practical--.

COLUMN 5

Line 14, "stable" should be deleted and "functional" should read --functional stable--.

COLUMN 7

Line 53, "advantageous" should read --advantageous,--.

UNITED STATES PATENT AND TRADEMARK OFFICE
CERTIFICATE OF CORRECTION

PATENT NO. : 5,294,285
DATED : March 15, 1994
INVENTOR(S) : MASAHIRO KANAI, ET AL.

It is certified that error appears in the above-identified patent and that said Letters Patent is hereby corrected as shown below:

COLUMN 8

Line 29, "substance" should read --substances--.
Line 49, "monocrystal" should read --single crystal-- and "GaAs-monocrystal" should read --GaAs-single crystal--.
Line 53, "monocrystal" should read --single crystal--.

COLUMN 9

Line 15, "to" should be deleted.

COLUMN 10

Line 39, "monocrystal" should read --single crystal--.

COLUMN 11

Line 10, "monocrystal" should read --single crystal--.
Line 30, "in" should read --in- --.
Line 31, "monocrystal" should read --single crystal--.
Line 50, "to" should be deleted.

COLUMN 12

Line 16, "in stead" should read --instead--.
Line 17, "monocrystal" should read --single crystal--.
Line 49, "monocrystal" should read --single crystal--.

UNITED STATES PATENT AND TRADEMARK OFFICE
CERTIFICATE OF CORRECTION

PATENT NO. : 5,294,285

DATED : March 15, 1994

INVENTOR(S) : MASAHIRO KANAI, ET AL.

It is certified that error appears in the above-identified patent and that said Letters Patent is hereby corrected as shown below:

COLUMN 13

Line 19, "monocrystal" should read --single crystal--.
    Line 41, "monocrystal" should read --single crystal--.
    Line 45, "As a result that" should be deleted.

COLUMN 14

Line 22, "monocrystal" should read --single crystal--.
    Line 23, "monocrystal" should read --single crystal--.
    Line 57, "in stead" should read --instead--.
    Line 58, "monocrystal" should read --single crystal--.
    Line 61, "whereby" should read --thereby--.

COLUMN 15

Line 8, "monocrystal" should read --single crystal--.
    Line 46, "monocrystal" should read --single crystal--.
    Line 67, "monocrystal" should read --single crystal--.

COLUMN 16

Line 49, "monocrystal" should read --single crystal--.
    Line 50, "monocrystal" should read --single crystal--.

COLUMN 17

Line 16, "monocrystal" should read --single crystal--.
    Line 55, "monocrystal" should read --single crystal--.

UNITED STATES PATENT AND TRADEMARK OFFICE
CERTIFICATE OF CORRECTION

PATENT NO. : 5,294,285
DATED : March 15, 1994
INVENTOR(S) : MASAHIRO KANAI, ET AL.

Page 4 of 5

It is certified that error appears in the above-identified patent and that said Letters Patent is hereby corrected as shown below:

COLUMN 18

Line 10, "monocrystal" should read --single crystal--.
    Line 61, "monocrystal" should read --single crystal--.
    Line 62, "monocrystal" should read --single crystal--.

COLUMN 19

Line 25, "monocrystal" should read --single crystal--.

COLUMN 21

Line 23, "monocrystal" should read --single crystal--.
    Line 40, "20-4" should read --20-4,--.

COLUMN 22

Line 13, "in stead" should read --instead--.
    Line 24, "in stead" should read --instead--.

COLUMN 23

Line 33, "mono-" should read --single--.

COLUMN 24

Line 45, "$Si_2Cl_3F_3$," should read --$Si_2Cl_3F_3$.--.

COLUMN 25

Line 8, "$Bf_3$," should read --$BF_3$,--.
    Line 24, "if" should read --of--.

UNITED STATES PATENT AND TRADEMARK OFFICE
CERTIFICATE OF CORRECTION

PATENT NO. : 5,294,285
DATED : March 15, 1994
INVENTOR(S) : MASAHIRO KANAI, ET AL.

It is certified that error appears in the above-identified patent and that said Letters Patent is hereby corrected as shown below:

<u>COLUMN 27</u>

Line 62, "$SiHBr_3$  $SiH_2BR_2$" should read --$SiHBr_3$, $SiH_2Br_2$,--.

<u>COLUMN 28</u>

Line 25, "$B_4H_{10}B_5H_9$," should read --$B_4H_{10}$, $B_5H_9$,--.

<u>COLUMN 29</u>

Line 24, "Sisingle" should read --Si-single--.
Line 38, "claim 19," should read --claim 18,--.

Signed and Sealed this

Sixth Day of December, 1994

Attest:

BRUCE LEHMAN

Attesting Officer    Commissioner of Patents and Trademarks